(12) United States Patent
Izumi

(10) Patent No.: US 6,267,816 B1
(45) Date of Patent: Jul. 31, 2001

(54) METHOD FOR SINGLE CRYSTAL GROWTH

(75) Inventor: Teruo Izumi, Amagasaki (JP)

(73) Assignee: Sumitomo Sitix Corporation, Amagasaki (JP)

( * ) Notice: Subject to any disclaimer, the term of this patent is extended or adjusted under 35 U.S.C. 154(b) by 0 days.

(21) Appl. No.: 09/147,460

(22) PCT Filed: Apr. 30, 1998

(86) PCT No.: PCT/JP98/01975

§ 371 Date: May 19, 1999

§ 102(e) Date: May 19, 1999

(87) PCT Pub. No.: WO98/49378

PCT Pub. Date: Nov. 5, 1998

(30) Foreign Application Priority Data

Apr. 30, 1997 (JP) .................................................. 9/128020

(51) Int. Cl.⁷ .................................................. C30B 15/20
(52) U.S. Cl. .................................. 117/30; 117/32; 117/917
(58) Field of Search ............................ 117/13, 30, 32, 117/917

(56) References Cited

U.S. PATENT DOCUMENTS

| | | |
|---|---|---|
| 5,178,720 | 1/1993 | Frederick . |
| 5,882,398 * | 3/1999 | Sonokawa et al. ............... 117/32 |
| 5,935,327 * | 8/1999 | Hariri et al. ............... 117/218 |
| 5,938,836 * | 8/1999 | Tomioka et al. ............... 117/30 |
| 5,976,246 * | 11/1999 | Iino et al. ............... 117/30 |

FOREIGN PATENT DOCUMENTS 5-194077   8/1993   (JP) .

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

This is a method for growing by pulling single crystals 6 using CZ process from material melt 5 to which cusp magnetic field is applied. Inside diameter U of the crucible 3 that contains the material melt 5 is (Y+140 mm) or larger and less than 3Y, where Y stands for outside diameter of the single crystal 6. When cusp magnetic field is applied, high pulling yield is maintained even if the inside diameter U of the crucible is small. Oxygen yield and dislocation free yield are improved by reducing inside diameter U of the crucible. As a result, the yield of manufacturing single crystals 6 is improved.

12 Claims, 4 Drawing Sheets

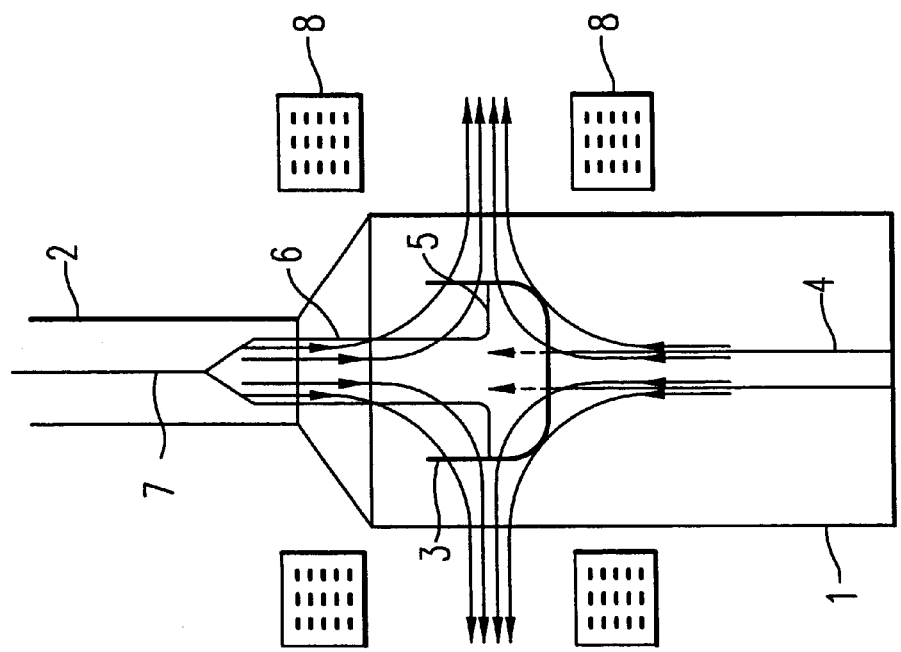
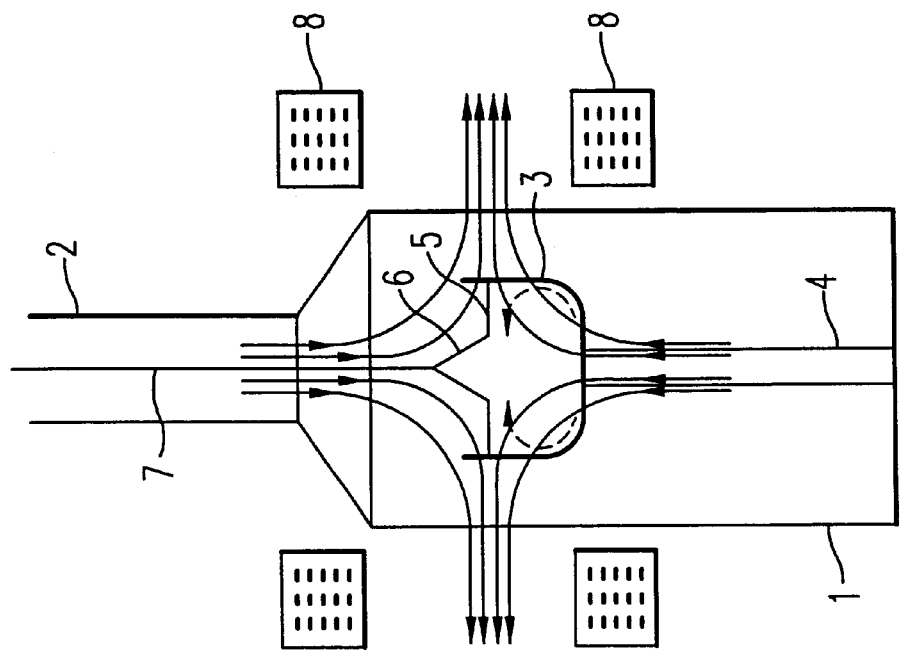

METHOD FOR SINGLE CRYSTAL GROWTH

BACKGROUND OF THE INVENTION

1. Field of the Invention

The present invention relates to a method for growing single crystals used for manufacturing single crystals such as those of silicon from which to obtain silicon wafers used as materials for semiconductor devices and, more precisely, to a method for growing single crystals called the MCZ process in which single crystals are pulled by the CZ process from the material melt in a crucible to which magnetic field is applied.

2. Description of the Background

In pulling single crystals using CZ process, as shown in FIGS. 4(a) and 4(b), a quartz crucible 3 is held with a pedestal 4 in a main chamber 1, and a single crystal 6 is pulled with a wire 7 with rotation from the material melt 5 formed in the crucible 3 into a pull chamber 2. Here, oxygen from the quartz crucible 3 dissolves into the material melt 5 in the crucible 3, and as a result oxygen is taken into the single crystal 6. As a larger amount of oxygen in the single crystal 6 will cause various defects in the crystal and deterioration in device properties when processed into semiconductor devices, reduction of oxygen concentration is an important technical problem in drawing single crystals 6 using CZ process. As a technology for solving this problem, there is a process called MCZ jointly utilizing magnetic field application, and processes utilizing cusp magnetic field such as described in Published Patent Application No. 2-1290 are recognized especially effective. This process is the one in which axisymmetrical and radial cusp magnetic field is applied to material melt 5 in a crucible 3 using a pair of circular magnets above and below 8. 8 as jointly shown in FIGS. 4(a) and 4(b). This process is characterized by the way convection of material melt 5 in a crucible 3 is suppressed by allowing the magnetic fields above and below to repulse one another near the material melt 5 to form an axisymmetrical magnetic field bent almost at right angles, thus expanding the field portion lying at right angles across the side wall and the bottom of the crucible.

Material melt 5 is convecting in the crucible 3 along the inside surface as indicated by broken-line arrows. Although fresh material melt 5 is supplied in the vicinity of the inside surface of the crucible 3 due to this convection promoting oxygen elution from the inside surface, a magnetic field lying across the side wall and the bottom of the crucible 3 suppresses convection along the inside wall of the crucible 3, thus suppressing this oxygen elution from the inside surface of the crucible. And in order to enhance this suppression effect it is considered to be necessary to expand the field portion lying at right angles across the side wall and the bottom of the crucible 3, resulting in reduction of field portion lying at right angles across the liquid surface of the material melt 5.

Incidentally, in pulling single crystals by CZ process, the yield is mainly determined by single crystal pulling yield, oxygen yield, and dislocation free yield. The pulling yield is the yield due to deformation of single crystals causing difficulty in continuation of withdrawing, and the oxygen yield is the yield due to change in oxygen concentration distribution in the pulling direction forming areas with oxygen concentration above permissible level. The dislocation free yield is the yield due to first dislocation generation during single crystal pulling causing the pulled region thereafter to become unusable.

And the total yield, namely the actual yield, is determined by the smallest of the three yields, usually being determined by the oxygen yield or the dislocation free yield in CZ pulling using cusp magnetic field. Thus, in CZ pulling using cusp magnetic field, though pulling is typically continued to over 90% of the material melt weight, total yield is actually limited to 60–70% due to first dislocation generation around 60–70% or drastic change in oxygen concentration thereafter. The reason will be explained below.

In pulling single crystals using CZ process, there is a problem of oxygen concentration decrease in the single crystals as pulling proceeds with or without application of magnetic field. Thus, while oxygen in the material melt in the crucible is supplied from inside surface of the crucible, it evaporates as SiO from the free surface of the melt. While the latter evaporation is constant throughout the whole period of pulling, the former supply decreases as time passes because the material melt in the crucible decreases as pulling proceeds reducing the contact area between the two of them. As a result, oxygen concentration in the material melt decreases as pulling proceeds, lowering oxygen concentration in the single crystal.

Here, when cusp magnetic field is applied, while oxygen concentration decreases as convection in the material melt is suppressed lowering oxygen concentration throughout the single crystal, oxygen concentration decrease along the time accompanying the progress of pulling still remains, and in the later period of pulling this oxygen concentration even increases. This phenomenon occurs from various overlapping reasons, one of which is supply of high oxygen concentration material melt from the vicinity of the bottom of the crucible to the interface of the single crystal caused by material melt thickness decrease in the crucible such as described below.

In single crystal pulling using CZ process, as shown in FIG. 4(b), material melt 5 in the crucible 3 is consumed as pulling proceeds, and the surface level of the material melt 5 is lowered. Even though the crucible 3 is gradually raised to prevent this surface level lowering, the melt thickness from the bottom of the crucible 3 to the surface of the melt continues to decrease, and the thickness becomes small in the later period of pulling. Separate from the convection along the inside surface of the crucible 3, a strong upward flow occurs in the central part of the material melt 5 due to relative rotation between the single crystal 6 and the material melt 5, and in the later period when melt thickness becomes small, melt with high oxygen concentration that has stayed near the bottom of the crucible 3 begins to be supplied by this upward flow directly to the interface between the single crystal 6 and the material melt 5. Moreover, in the later period of pulling, as the bottom of the crucible 3 comes close to the center of the cusp magnetic field, the portion of magnetic field lying perpendicularly across the bottom decreases reducing the convection suppression effect to suppress oxygen elution. As a result of these, oxygen concentration increases as time passes even after allowing for the reduction in oxygen elution due to decrease in contact area reduction between the crucible 3 and the material melt 5.

This increase in oxygen concentration becomes a factor determining the yield of single crystal as it is conspicuous in company with the decrease in oxygen concentration accompanying the progress of pulling, though it is confined in the later period of pulling.

On the other hand, recent scaling up in diameter of single crystals relates to the dislocation free yields. Thus, as single crystals become larger, the diameter of the crucible increases accordingly. When temperature gradient of the material melt in the radial direction of the crucible is constant, the crucible temperature increases as the diameter of the crucible becomes larger. The crucible temperature rise will promote elution loss from inside of the quartz crucible causing first dislocation generation of single crystals.

In pulling using cusp magnetic fields, though high values over 90% are secured for yield of pulling, actually the total yield is low because oxygen yield or dislocation free yield is 60%–70%, lower than pulling yield.

SUMMARY OF THE INVENTION

The object of this invention is to provide a method for single crystal growth, promoting the total yield improvement by improving oxygen yield and dislocation free yield while maintaining high pulling yield.

DETAILED DESCRIPTION OF THE PREFERRED EMBODIMENTS

Incidentally, even in conventional CZ pulling using cusp magnetic fields, yield of pulling is relatively high. This is mainly because enough crucible diameter is secured.

Thus, as shown in FIG. 1, in the free surface of material melt 5 in a crucible 3, the melt temperature is the melting point of the material melt 5 at the outer edge position A of a single crystal 6, rises towards the periphery and becomes maximum at the inside surface position B of the crucible 3. When temperature gradient between A–B is small, the melting point position (outer edge position A) varies significantly along the radial direction accompanying outside disturbances such as output change of a heater located at the peripheral side of the crucible 3, causing significant crystal deformation and resulting in difficulty in pulling single crystals. As this is the factor determining the yield of pulling, a certain degree of temperature gradient is necessary to raise the yield, and so inside diameter T of the crucible that is large enough relative to the crystal diameter Y is secured. In other words, this is because the temperature gradient between A–B increases when inside diameter U of the crucible is increases, as the free surface areas increases in proportion to the squareof the diameter, promoting heat radiation from the free surface. And as a general rule, three times or more of the crystal diameter Y is selected as the inside diameter U of the crucible.

However, as mentioned above, the fact is that the total yield is not determined by the yield of pulling, but by the lower oxygen yield and dislocation free yield. Also with cusp magnetic field being applied, there is a possibility of stable pulling being secured even if the inside diameter U of the crucible is small, as the temperature gradient is large even though the distance between A–B is the same, since convection along the inside surface of the crucible 3 is suppressed, so that the flow from B to a becomes slow and radiation of heat from the free surface is promoted.

The present inventors planned with these ideas as bases to make the inside diameter U of the crucible small with cusp magnetic field being applied and carried out various experiments, and found the following facts.

First, as with cusp magnetic field being applied convection between A–B is suppressed and radiation of heat from the free surface is promoted, enough temperature gradient is secured even if the inside diameter U of the crucible is small, so that it becomes possible to make the inside diameter U of the crucible smaller than before. Secondly, as thickness T of the same amount of melt becomes larger when the inside diameter U of the crucible becomes smaller, supply of melt with high oxygen concentration from the vicinity of the bottom of the crucible to the interface of the single crystal by upward flow in the center of the melt is suppressed. Also the distance between melt surface and the bottom of the crucible increases, and the portion of magnetic field across the bottom of the crucible is maintained. These suppresses increase in oxygen concentration during the later period of pulling, resulting in oxygen yield improvement. Thirdly, as inside diameter U of the crucible reduces, temperatures of the crucible 3 is lowered, its dissolution loss is suppressed, and the dislocation free yield increases. Thus, with magnetic field being applied, reduction of the inside diameter U of the crucible improves oxygen yield and dislocation for yield maintaining high yield is pulling, resulting in the total yield improvement.

Single crystal growing method of the present invention was developed based on this knowledge, and is characterized by using a crucible with inside diameter (crystal diameter÷140 mm) or larger and less than (crystal diameter×3) when pulling single crystals using CZ process from material melt in the crucible to which magnetic field is applied.

In a typical example of the single crystal growing method of the present invention, the material melt is silicon melt. The crucible is a quartz crucible. And the crucible is turned during pulling in the direction opposite from the rotation of the single crystal, and raised so that the liquid surface level of the material melt may stay constant.

When inside diameter U of the crucible is (crystal diameter×3) orlarger supply of melt with high oxygen concentration from the vicinity of the bottom of the crucible to the interface of the single crystal is promoted by melt thickness T reduction in the later period of pulling, and as significant rise in oxygen concentration occurs, decrease in oxygen yield as compared with pulling yield occurs accompanied by dislocation free yield decrease by crucible temperature rise, and the total yield is determined by these yields. Therefore the inside diameter U of the crucible should be less than (crystal diameter×3) and preferably (crystal diameter×2.5) or less.

Concerning the lower limit of inside diameter U of the crucible, if inside diameter U of the crucible is extremely small as compared with crystal diameter Y, even though with magnetic field being applied, radiation of heat from free surface of material melt in the crucible is insufficient, and temperature gradient of the material melt in the radial direction of crucible reduces, causing significant temperature change of the material melt and difficulty in stable pulling, resulting in pulling yield reduction. As a result, total yield decreases as it is determined by pulling yield instead of oxygen yield or dislocation free yield which are improved. This determines the lower limit of inside diameter U of the crucible and is (crystal diameter−140 mm).

FIG. 2 is a graph showing the relation between inside diameter U of the crucible and the pulling length when inside diameter U of the crucible was varied in pulling a single crystal (crystal diameter 203 mm) with cusp magnetic field being applied. While sufficient pulling is not possible when inside diameter U of the crucible is less than 343 mm, drawing up to the target length is possible when it is 343 mm or larger, namely (crystal diameter+140 mm) or larger.

The crucible is preferably the deep bottom type to avoid reduction in melt holding capacity accompanying its inside diameter decrease.

The magnetic field is preferably a cusp magnetic field, a combination of horizontal and vertical magnetic fields, but the present invention is effective with horizontal or vertical magnetic field also. Maintenance of pulling yield by suppression of convection between A–B and improvement of dislocation free yield by crucible temperature reduction can be expected with both horizontal and vertical magnetic fields, and horizontal magnetic field also has a promotive effect in oxygen yield improvement by increase in melt thickness.

The cusp magnetic field is applied across the peripheral wall and the bottom of the crucible, and desirably applied so that more portion of it lies at right angles across the peripheral wall and the bottom of the crucible.

BRIEF DESCRIPTION OF THE DRAWINGS

FIGS 4A and 4B illustrates a conventional method for growing single crystals.

BEST MODE FOR CARRYING OUT THE INVENTION

Figure 1:
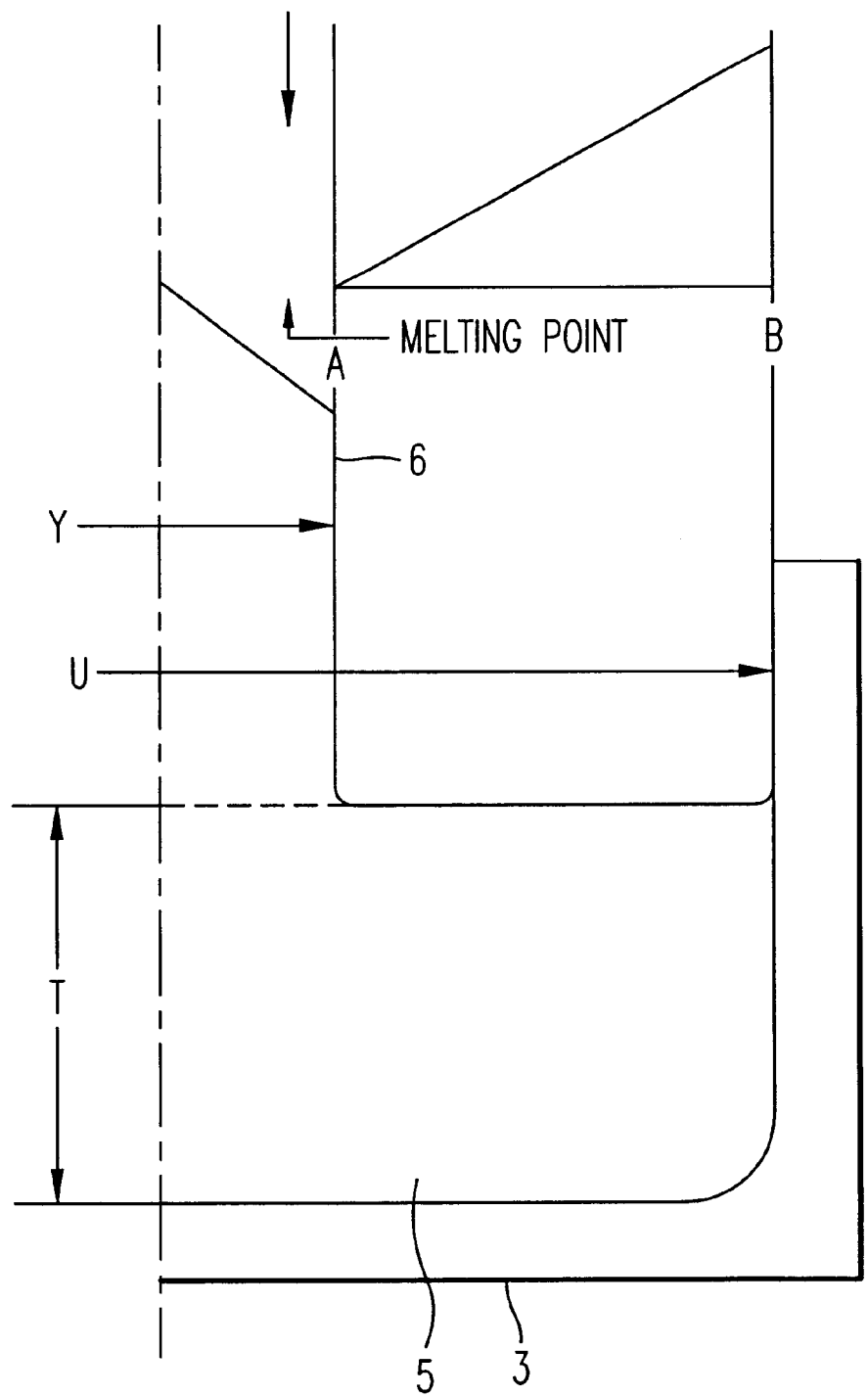
FIG. 1 shows a schematic view of the pulling state for explaining the principle of the present invention.
Figure 2:
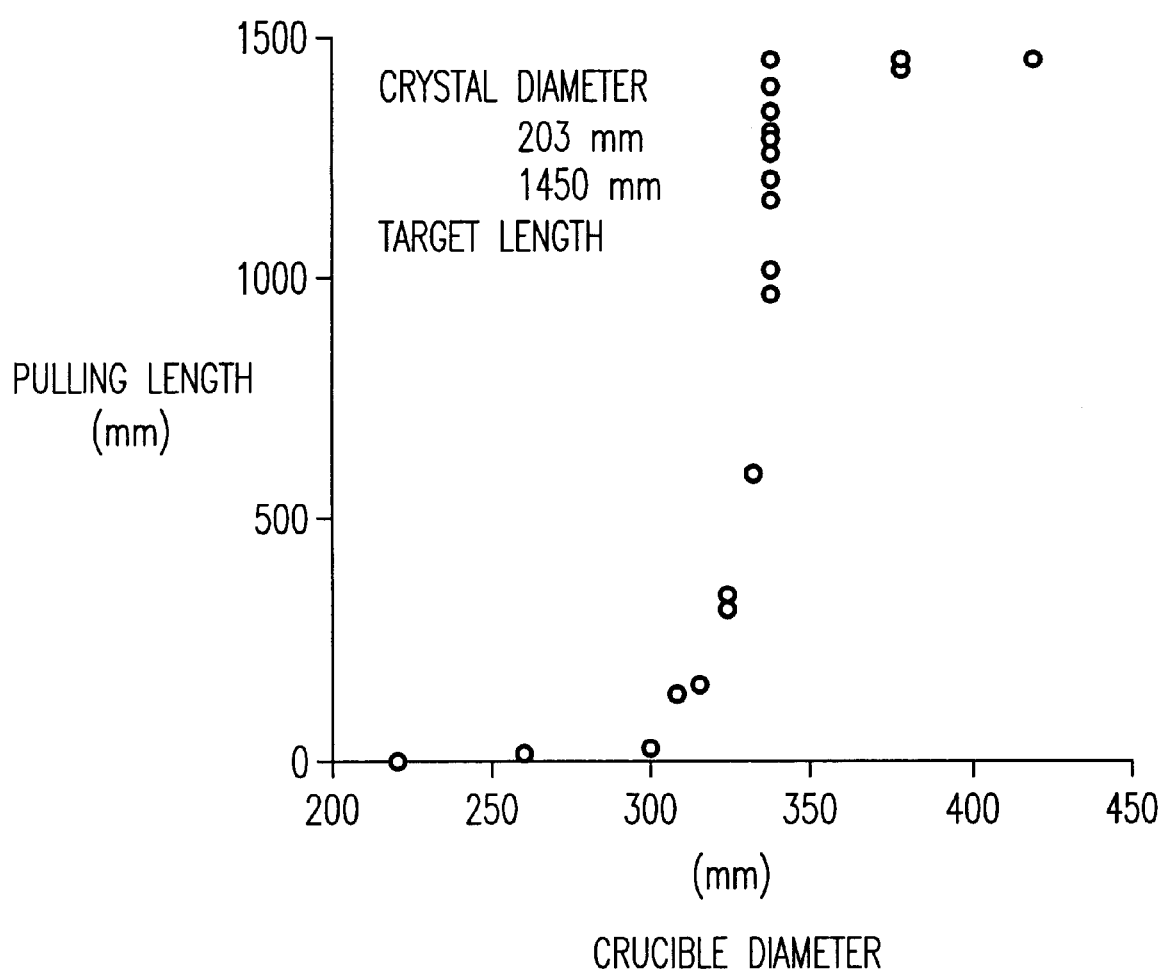
FIG. 2 is a graph showing the relation between inside diameter of a crucible and the length of pulling.

A preferable embodiment of the present invention is explained below with reference to FIG. 3.

The single crystal growing apparatus used in the method for growing single crystals of the present embodiment is equipped with the main body 10 of a growing apparatus for pulling a single crystal 18 from material melt 12 in a crucible 11, and a magnetic field generating means 20 produced outside the main body 10 of the growing apparatus.

The main body 10 of the growing apparatus is provided with a main chamber 14 composed such as of non-magnetic stainless steel and a small diameter pull-chamber 15 built on it, having a construction to hold a quartz crucible 11 with a pedestal 16 in the center of the main chamber 14. The pedestal 16 is constructed with non-magnetic stainless steel and the like, and driven in the directions of axis and circumferences for raising and turning the crucible 11. Parts such as a heater that are not shown in the figure are located in the periphery outside the crucible 11.

And the inside diameter of the crucible 11 is smaller than the conventional ones, particularly less than three times the crystal diameter Y. Also the crucible 11 is deeper than the conventional ones to avoid decrease of capacity for material melt 12 as a result of decrease in inside diameter U of the crucible.

The magnetic field generating means 20 is composed of a pair of upper and lower circular magnets 21, 21 for cusp magnet field provided outside the periphery of the main chamber 14.

In pulling a single crystal 13, material melt 12 is formed in the crucible 11 by way of a predetermined procedure. Cusp magnetic field is applied to material melt 12 by passing electric current in reverse directions to the circular magnets 21, 21. In this condition a single crystal 13 is pulled using a wire 18 from the material melt 12. Here the crucible 11 and the single crystal 13 are turned in opposite directions.

Accompanying the pulling of the single crystal 13, the material melt 12 in the crucible 11 is consumed. In order to avoid accompanying lowering of the surface of the material melt 12, the pedestal 16 is driven upward to raise the crucible 11 gradually.

Figure 3B:
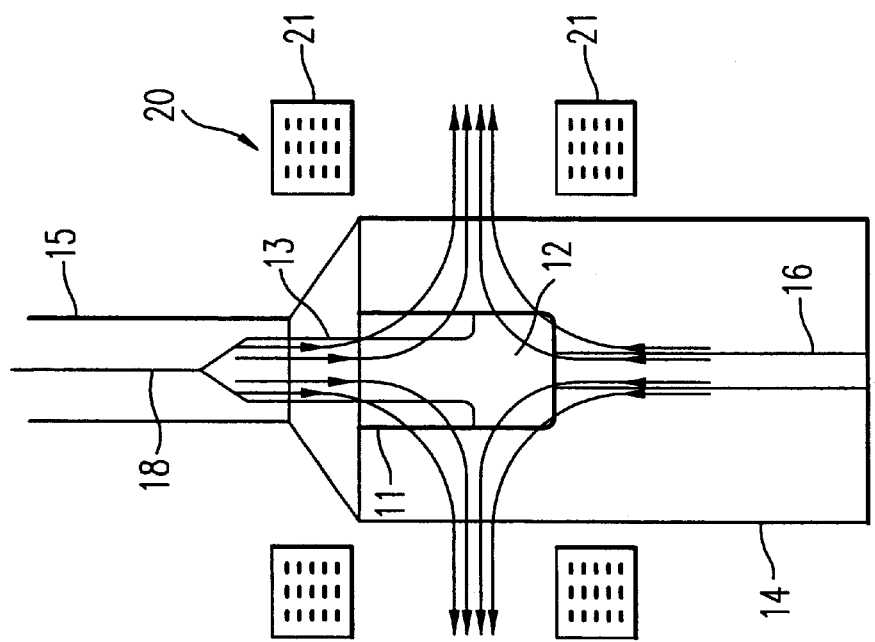
FIGS. 3A and 3B illustrates a method for growing single crystals relating to an embodiment of the present invention.
Figure 3A:
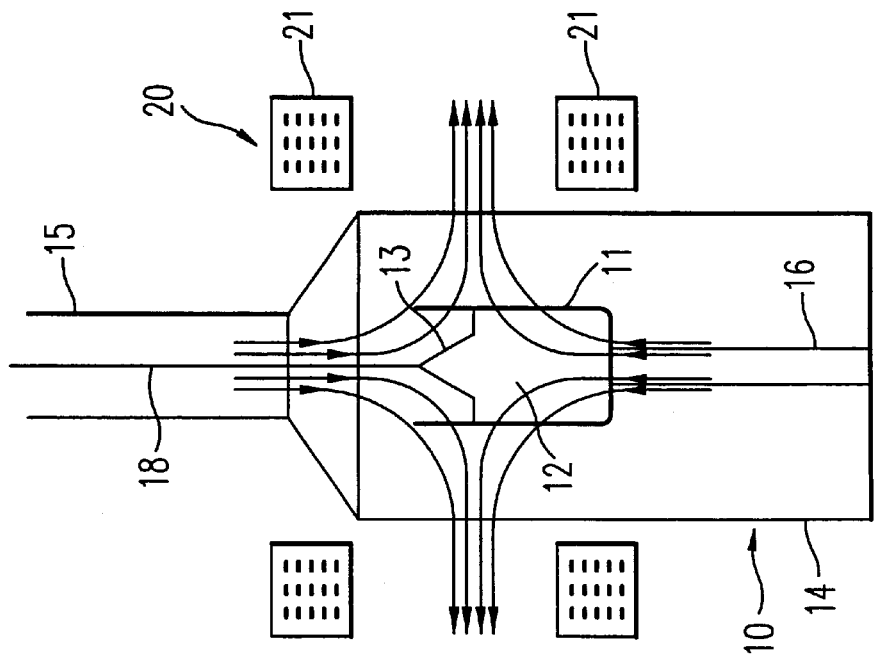

Though the amount of melt in the crucible 11 decreases in the later period of pulling as shown in FIG. 3(b), the melt thickness of the same amount of residual melt is larger than with the conventional ones, as inside diameter of the crucible 11 is smaller than that of conventional ones. Because of this, supply of high oxygen concentration melt from the bottom of the crucible to the solid-liquid interface is to the upward flow occurring in the center of the material melt 12 is suppressed. As a result, oxygen yield is improved, as the rise in oxygen concentration in the later period of pulling of a single crystal 13 is suppressed, and the oxygen concentration distribution in the direction of pulling is averaged.

Also, as the temperature of the crucible 11 is lowered due to reduction of inside diameter of the crucible 11, first dislocation generation of the single crystal 13 due to its elution loss is prevented, and dislocation free yield is improved.

On the other hand, concerning the pulling yield, as cusp magnetic field is applied to the material melt 12 in the crucible 11, and convection along the inside wall of the crucible 11 is suppressed, large temperature gradient in the radial direction of the material melt 12 is secured. Therefore, as deformation of the single crystal 13 due to temperature change in the material melt 12 is suppressed, and pulling does not become unstable even with reduced inside diameter of the crucible 11, lowering of pulling yield is avoided.

Thus, the total yield is improved.

Next, the effect of the present invention is made clear by showing embodiments of the present invention in comparison with conventional and comparative examples.

In pulling single crystals with diameter of 8 inches (203 mm) from 150 kg of a material melt consisting of silicon to which cusp magnetic field is applied, crucibles with the same capacity and various inside diameters were used. Five kinds of crucibles with inside diameter U of 24 inches which is three times the crystal diameter Y, 22 inches which is 2.75 times the crystal diameter Y, 20 inches which is 2.5 times the crystal diameter Y, 16 inches which is twice the crystal diameter Y, and 13 inches which is 1.63 times the crystal diameter Y were chosen. Difference between the diameters of the crucibles U and the crystal diameter Y are 16 inches (406 mm), 14 inches (356 mm), 12 inches (305 mm), 8 inches (203 mm), and 5 inches (127 mm) respectively. Magnetic field strength is set at 500 gausses. Table 1 shows test conditions, and Table 2 shows test results. and the total yield was approved to 72.0% (dislocation of the yield) in Example 1, 80.3% (oxygen yield) in Example 2, 91.2% (oxygen yield) in Example 3.

However, in case inside diameter U of the crucible was 1.63 times the diameter Y of the crystal (U=Y−127) (Comparative example 1), deformation occurred at about 20% of the pulling stage, making pulling difficult to continue, and the total yield was determined by this pulling yield (20.0%).

Comparative examples 2 and 3 were cases without cusp magnetic field application. In Comparative example 2 where inside diameter U of the crucible was 2.75 times the diameter Y of the crystal, dislocation yield significantly decreased as inside diameter U of the crucible was decreased without magnetic field application. Pulling yield also decreased. The total yield was only 25.5% determined by the dislocation free yield. Also, in Comparative example 3 where inside diameter U of the crucible was twice the diameter Y of the crystal, deformation occurred at about 16% of the pulling stage, making pulling difficult to continue, and the total yield was determined by this pulling yield (16.7%). Incidentally, with cusp magnetic field being applied, high total yield was attained in case inside diameter U of the crucible was either 2.75 times or twice the diameter Y of the crystal (Example 1, 3), as described above.

Industrial Applicability

As explained above, the method for growing single crystals of the present invention can improve oxygen yield and dislocation free yield while maintaining high pulling yield, resulting in improvement of the total yield, by decreasing inside diameter of the crucible in CZ pulling jointly using magnetic field application. Thus, when applied to manufacture of silicon single crystals, the present invention will exhibit great effects in its cost reduction and also in cost reduction in manufacture of semiconductor devices.

TABLE 1

|  | Amount charged | Crystal diameter Y | Magnetic field applied to the crucible wall | Inside diameter of the crucible U (inches) | Relations between Y and U |
|---|---|---|---|---|---|
| Conventional example | 150 kg | 8 inches (203 mm) | 500 gausses | 24 | U = 3 Y |
| Example 1 |  |  |  | 22 | U = 2.75 Y |
| Example 2 |  |  |  | 20 | U = 2.5 Y |
| Example 3 |  |  |  | 16 | U = 2 Y |
| Comparative example 1 |  |  |  | 13 | U = Y + 127 mm |
| Comparative example 2 |  |  | 0 | 22 | U = 1.75 Y |
| Comparative example 3 |  |  | 0 | 16 | U = 2 Y |

TABLE 2

|  | Yield of pulling (%) | Oxygen yield (%) | Dislocation free yield (%) | Total yield (%) | Notes |
|---|---|---|---|---|---|
| Conventional example | 89.5 | 65.7 | ~68 | 65.7 |  |
| Example 1 | 92.3 | 73.6 | ~72 | 72.0 |  |
| Example 2 | 92.2 | 80.3 | ~85 | 80.3 |  |
| Example 3 | 92.2 | 91.2 | ~96 | 91.2 |  |
| Comparative exampel 1 | 20.0 | — | — | 20.0 | Deformation occurred at about 20% and pulling was difficult to continue. |
| Comparrative example 2 | 90.2 | 40.5 | ~25.0 | 25.0 |  |
| Comparative example 3 | 16.7 | — | — | 16.7 | Deformation occurred at about 16.7% and pulling was difficult to continue. |

In case inside diameter U of the crucible was three times the diameter Y of the crystal (Conventional example), pulling yield was high but oxygen yield and dislocation yield were comparatively low, and the total yield was 65.7% determined by the lowest oxygen yield.

On the other hand, in case inside diameter U of the crucible was 2.75, 2.5, or 2 times the diameter Y of the crystal (Example 1, 2, or 3), while high pulling yield was maintained, oxygen yield and dislocation free yield increased.

What is claimed is:

1. A method for growing single crystals, which comprises effecting growing said crystals with a crucible having an diameter of (crystal diameter+140 mm) or larger and less than (crystal diameter×3), and pulling said single crystals using a CZ process from a material melt in said crucible to which a magnetic field is applied; and wherein said magnetic field is a cusp magnetic field of a combination of horizontal and vertical magnetic fields.

2. The method for growing single crystals of claim 1, wherein said material melt is silicon melt.

3. The method for growing single crystals of claim 1, wherein said crucible is a quartz crucible.

4. The method for growing single crystals of claim 1, wherein said crucible is a deep bottom crucible that avoids reduction of capacity for holding the melt accompanying reduction in inside diameter.

5. The method for growing single crystals of claim 1, wherein in crystal pulling, said crucible turns in direction opposite from the direction of rotation of the crystal and rises so that the surface level of the material melt is maintained constant.

6. The method for growing single crystals of claim 1, wherein said cusp magnetic field lies across the peripheral wall and the bottom of the crucible.

7. The method for growing single crystals of claim 1, wherein said inside diameter of said crucible is less than (crystal diameter×2.5).

8. The method for growing single crystals of claim 1, wherein said crucible is a deep bottom crucible.

9. The method for growing single crystals of claim 1, having a yield of pulling of about 92.2 to 92.3%.

10. The method for growing single crystals about of claim 1, having a oxygen yield of about 73.6 to 91.2%.

11. The method for growing single crystals about a claim 1, having a dislocation free yield of about 72 to 96%.

12. The method for growing single crystals of claim 1, having a total of yield of about 72.0 to 91.2%.

* * * * *